United States Patent
Breslauer et al.

(10) Patent No.: US 6,637,027 B1
(45) Date of Patent: Oct. 21, 2003

(54) SYSTEM AND METHOD FOR CONTROLLING ACCESS TO BROADCAST SERVICES

(75) Inventors: Heidi H. Breslauer, Kirkland, WA (US); Michael K. Fleming, Santa Cruz, CA (US); Robert M. Fries, Redmond, WA (US)

(73) Assignee: WebTV Networks, Inc., Mountain View, CA (US)

(*) Notice: Subject to any disclaimer, the term of this patent is extended or adjusted under 35 U.S.C. 154(b) by 0 days.

(21) Appl. No.: 09/526,372

(22) Filed: Mar. 16, 2000

(Under 37 CFR 1.47)

Related U.S. Application Data

(60) Provisional application No. 60/125,016, filed on Mar. 18, 1999.

(51) Int. Cl.$^7$ ................................................ H04N 7/173
(52) U.S. Cl. .......................... 725/25; 725/28; 725/86; 725/87; 725/109; 725/110; 725/5
(58) Field of Search ................................. 725/25, 31, 6, 725/1, 2, 5, 28, 48, 86, 109, 110, 87

(56) References Cited

U.S. PATENT DOCUMENTS

| | | | | |
|---|---|---|---|---|
| 5,016,272 A | * | 5/1991 | Stubbs et al. ............... 380/233 |
| 5,751,335 A | * | 5/1998 | Shintani ...................... 725/25 |
| 5,828,402 A | * | 10/1998 | Collings ...................... 725/28 |
| 5,862,324 A | * | 1/1999 | Collins ........................ 709/220 |
| 5,884,284 A | * | 3/1999 | Peters et al. ................... 705/30 |
| 5,973,683 A | * | 10/1999 | Cragun et al. ............... 345/719 |
| 6,006,264 A | * | 12/1999 | Colby et al. ................. 709/226 |
| 6,055,315 A | * | 4/2000 | Doyle et al. ................. 380/242 |
| 6,157,377 A | * | 12/2000 | Shah-Nazaroff et al. ..... 345/719 |
| 6,370,580 B2 | * | 4/2002 | Kriegsman .................. 709/226 |
| 6,424,717 B1 | * | 7/2002 | Pinder et al. ................ 380/239 |
| 6,434,562 B1 | * | 8/2002 | Pennywitt et al. ............. 707/10 |

FOREIGN PATENT DOCUMENTS

WO     98 56188     10/1998

OTHER PUBLICATIONS

"Functional Model of a Conditional Access System," EBU Review Technical, BE, European Broadcasting Union. Brussels, No. 266, Dec. 21, 1995, pp. 64–77, Grand–Saconnex, CH, XP000559450.

\* cited by examiner

*Primary Examiner*—John Miller
*Assistant Examiner*—Nathan A Sloan
(74) *Attorney, Agent, or Firm*—Workman, Nydegger

(57) ABSTRACT

A multimedia system is described that is capable of presenting multimedia segments including television broadcasts, radio broadcasts, stored video information, stored audio information, and Web pages. The multimedia system includes a conditional access manager which is a common interface between the multimedia system and a number of conditional access providers even if the conditional access providers follow different interface standards. In order to access a multimedia segment such as a television program, a radio program, or Web page, the multimedia system receives a request to access the multimedia segment. While accessing the multimedia segment, each of the conditional access providers is notified of the request through the conditional access manager. Each conditional access provider then determines whether permission to access the multimedia segment should be denied, or whether the conditional access provider does not know of any reason why permission to access the multimedia segment should be denied. Based on the responses from the conditional access providers, the segment is either displayed or blocked from being displayed.

33 Claims, 5 Drawing Sheets

SYSTEM AND METHOD FOR CONTROLLING ACCESS TO BROADCAST SERVICES

CROSS-REFERENCE TO RELATED APPLICATIONS

The present application is a non-provisional United States patent application based on a United States provisional patent application having a Ser. No. 60/125,016, filed Mar. 18, 1999, and entitled "Expandable Software Architecture For Broadcast Conditional Access", which provisional application is incorporated herein by reference.

BACKGROUND OF THE INVENTION

1. The Field of the Invention

The present invention relates to electrical computers and data processing systems. Specifically, the present invention relates to systems and methods for controlling access to multimedia services such as broadcasts, stored files, and/or remote downloads.

2. The Prior State of the Art

Multimedia services are available in a variety of forms. The multimedia service might be broadcast content or "broadcast feed" which may include video information as in a television broadcast, audio-only information as in a radio broadcast, or Internet data as in an Internet multicast. Multimedia services may also include access to resources on a network such as a file stored on the network. This resource might be, for example, a Web page or other file remotely stored on a Local Area Network (LAN) or on a Wide Area Network (WAN) such as the Internet.

In the case of broadcast content, many modern systems receive and process broadcast content using a device containing a microprocessor before the broadcast content is presented to the user. Such devices, which include able television set-top boxes, digital satellite television receivers, and personal computers equipped with broadcast receiver hardware, are commonly referred to as Integrated Receiver/Decoders or "IRDs".

In such systems, it is common to have the IRD device control which components of the broadcast feed are appropriate for presentation to the user. For example, a broadcast data provider, such as a television or radio broadcaster, may have a right to condition access to certain broadcast content on the satisfaction of certain conditions. For instance, a pay-per-view provider may condition access on a user calling the provider and paying a fee by credit card or upon the debiting of a smart card. Furthermore, a premium channel provider may condition access upon the user subscribing to the premium channel. The IRD device enforces such conditional access to broadcast content on a client-by-client basis at the receiver end of a broadcast network. The hardware or software component in the IRD that ensures that the broadcast segment is not presented unless these conditions are satisfied is called a "conditional access provider." Once the conditions for access have been satisfied, the conditional access provider permits the relevant broadcast content segment to be presented to the user.

It may also be desirable that entities other than the broadcaster control access. For example, parents may wish to control their children's access to broadcast segments having certain content. A parent might do this by watching a broadcast segment with the child and changing the channel when questionable content is presented.

Unfortunately, parents may not always be able to watch the entire broadcast segment with the child. Some multimedia segments such as television programs include a displayed rating which at least broadly indicates the program's level of violence, nudity, or other important factors. For example, the Motion Picture Association of America (MPAA) rating system is essentially age-based and includes G, PG, PG-13, R and NC-17 ratings. Some common age-based ratings for television include TV-Y, TV-Y7, TV-G, TV-PG, TV-14 and TV-MA. Also, there may be content-based ratings such as FV (Fantasy Violence), V (Violence), S (Sexual situations or activity), L (course Language), or D (suggestive Dialog).

Typically, the television ratings appear in the corner of the television screen during a brief period at the start of the television program. However, a parent may not be present during the brief time that the ratings are being displayed. Thus, hardware or software modules called "limits providers" have been developed to help parents set local policy limits on the broadcast segments that are presented to their children. These limits providers help parents set limits independent from any conditional access control desired by the content broadcaster.

Conventional broadcast systems may incorporate more than one conditional access provider. The broadcast system will typically use an interface such as an Application Program Interface or "API" to utilize the services of each of the conditional access providers. However, an interface that works for one conditional access provider may not work for another. Each additional interface requires further programming in order to deal with the additional interface. Thus, what is desired is a broadcast system and method that interfaces with conditional access providers in a more standardized fashion.

SUMMARY OF THE INVENTION

A multimedia system is described that is capable of presenting multimedia segments including television broadcasts, radio broadcasts, stored video, stored audio, and/or Internet data. The multimedia system includes a common standardized conditional access manager that interfaces the multimedia system with a number of conditional access providers. These conditional access providers may be software and/or hardware modules that enable providers of the multimedia segments to condition access to their multimedia segments upon certain conditions. For example, a television broadcaster may condition access to a premium channel or pay-per-view program based upon the payment of a specified sum. The conditional access provider may also be a limits provider, which is a software and/or hardware module that allows parents to restrict access to certain broadcast segments that the parents feel are inappropriate for their children.

In addition, the conditional access manager acts as a standard interface between the conditional access providers and the rest of the multimedia system. Since the interface is standard, the conditional access provider software is not informed of anything about the details of the multimedia system. Furthermore, the multimedia system is not informed of any of the details of the conditional access providers. Thus, the multimedia system and the conditional access providers can interoperate without proprietary information concerning the multimedia system and the conditional access provider being disclosed to each other.

In order to access a multimedia segment, the multimedia system receives a request to access the multimedia segment. For example, a user may request a television program using a remote control, or a user may request a Web page using an Internet browser.

During the process of accessing the multimedia segment, each of the conditional access providers is notified of the request through the conditional access manager. Each conditional access provider then determines whether permission to access the multimedia segment should be denied, or whether the conditional access provider does not know of any reason why permission to access the multimedia segment should be denied. If any of the conditional access providers determines that permission to access the multimedia segment should be denied, the multimedia segment is not presented. On the other hand, if none of the conditional access providers determines that permission to access the multimedia segment should be denied, and at least one of the conditional access providers determines that permission to access the multimedia segment should be granted, the multimedia broadcast segment is presented. If the multimedia segment is presented, but one of the conditional access providers later determines that permission to access should be denied, the presentation of the multimedia segment is then blocked.

Additional advantages of the invention will be set forth in the description which follows, and in part will be obvious from the description, or may be learned by the practice of the invention. The advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
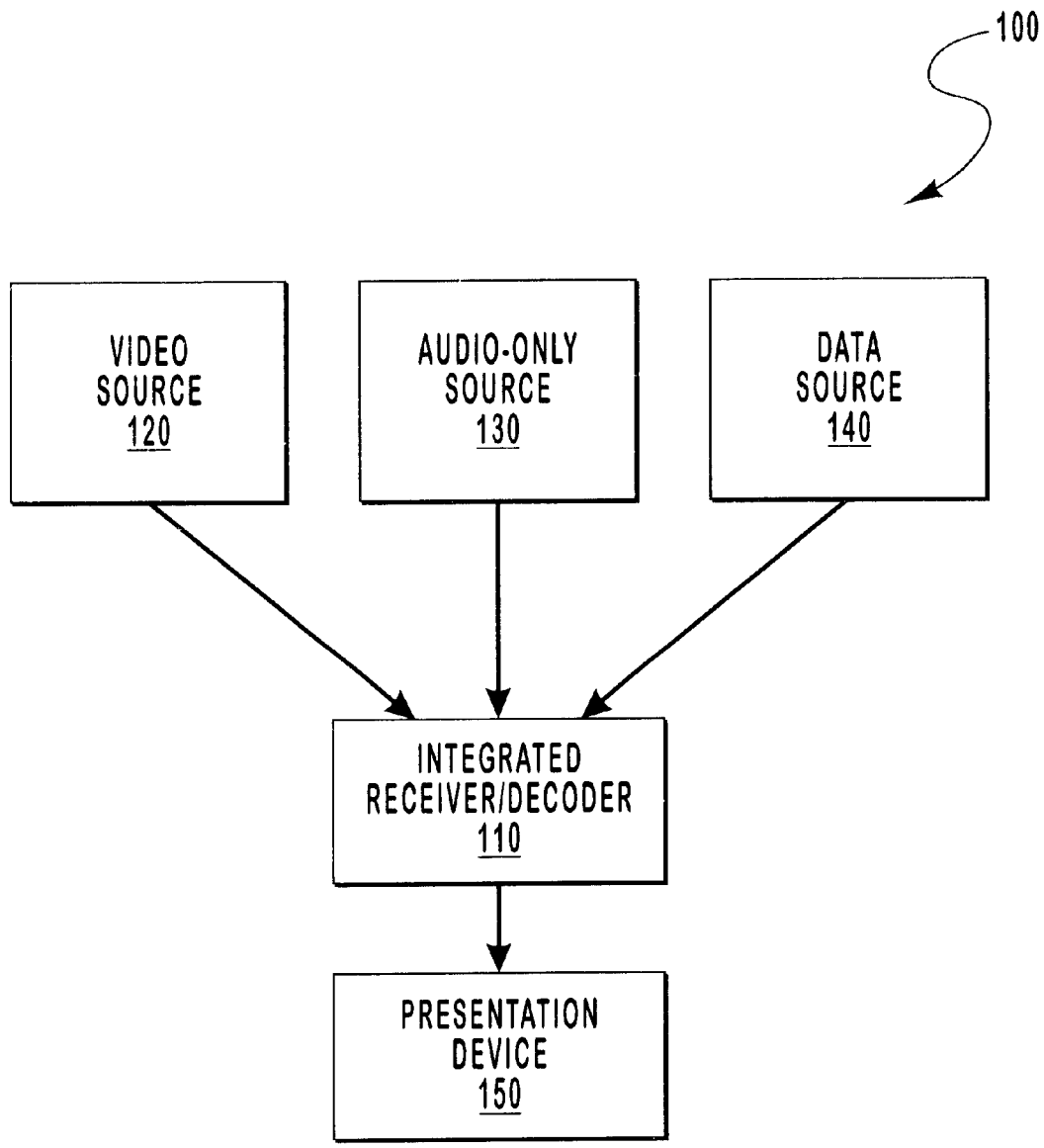
FIG. 1 schematically illustrates a suitable operating environment for the present invention.

In accordance with the present invention, a multimedia system that determines access privileges to a multimedia segment by interfacing with multiple conditional access providers is described. The definitions of several terms are now provided. These definitions apply throughout this description and in the claims.

A "conditional access provider" is defined as a hardware and/or software unit that is capable of automatically limiting access to a multimedia segment. This would include limits providers which allow for a parent to set local policy limits on the multimedia segment.

A "multimedia segment" is defined as any resource that includes viewable and/or hearable data. Examples of a multimedia segment include television programs, radio programs, Internet multicasts, Web pages or any other resource that results in viewable and/or hearable data. The multimedia segment may, for example, be a broadcast originating from a remote broadcaster, or may be a resource downloaded from a remote site over a Wide Area Network such as the Internet. The multimedia segment may also be a resource read over a Local Area Network or may also be a recorded broadcast. Essentially, the principles of the present invention allow for access to multimedia segments to be limited regardless of the source or format of the multimedia segments.

The conditional access provider may control the display of, for example, pay-per-view programs, other premium channel programs, and premium Web pages. Furthermore, the conditional access provider may allow a parent to set ratings limits so that multimedia, television programs, or Web pages that have certain ratings are not displayed.

The principles of the present invention allow for the interfacing with multiple conditional access providers even if those conditional access providers require different interfaces. Traditionally, if a device was to interface with multiple conditional access providers, a separate interface would be needed for each type of conditional access provider. Each separate interface required additional programming development time. The present invention allows for a single interface to interact with each conditional access provider thereby providing a more standardized interface.

The invention is described below by using diagrams to illustrate either the structure or processing of embodiments used to implement the system and method of the present invention. Using the diagrams in this manner to present the invention should not be construed as limiting of its scope. The embodiments of the present invention may comprise a special purpose or general purpose computer including various computer hardware, as discussed in greater detail below. The embodiments may further comprise multiple computers linked in a network environment.

Embodiments within the scope of the present invention also include computer readable media having executable instructions or data fields stored thereon. Such computer readable media can be any available media which can be accessed by a general purpose or special purpose computer. By way of example, and not limitation, such computer readable media can comprise RAM, ROM, EEPROM, CD-ROM or other optical disk storage, magnetic disk storage or other magnetic storage devices, or any other medium which can be used to store the desired executable instructions or data fields and which can accessed by a general purpose or special purpose computer. Combinations of the above should also be included within the scope of computer readable media. Executable instructions comprise, for example, instructions and data which cause a general purpose computer, special purpose computer, or special purpose processing device to perform a certain function or group of functions.

Although not required, the invention will be described in the general context of computer-executable instructions, such as program modules, being executed by a set top box.

Generally, program modules include routines, programs, objects, components, data structures, etc. that perform particular tasks or implement particular abstract data types. The invention will also be described by making reference to documents, which generally include or are defined by encoded data structures stored in a computer-readable medium or a computer memory device. The encoded data structures of documents often represent words, numbers, or other expression and generally may be generated, edited, displayed and/or stored using a computer.

In one embodiment, the invention is used in a system known as WebTV®, manufactured by WebTV Networks, Inc., of Palo Alto, Calif., which uses a conventional television screen or another display unit in combination with a networked computer for composing, sending and receiving e-mail, browsing the World Wide Web (Web), accessing other segments of the Internet, and otherwise displaying information. A WebTV® system uses standard telephone lines, Integrated Services Digital Network (ISDN) lines, cable lines associated with cable television service, or the like to connect to the Internet or other wide area networks.

FIG. 1 illustrates a network architecture 100 that represents a suitable operating environment for the present invention. For clarity, element numbers begin with a number corresponding to the figure that introduces the element. For example, the element number for the network architecture 100 begins with a "1" because the network architecture 100 is introduced in FIG. 1.

The network architecture 100 includes an Integrated Receiver/Decoder or "IRD" 110 which receives multimedia segments and determines whether the multimedia segments should be presented on the presentation device 150. The IRD 110 may be integrated within, for example, a set top box such as a WebTV® set top box in which case the presentation device 150 is a standard television set. However, the IRD 110 may also be integrated with the presentation device 150.

The IRD 110 may receive multimedia segments from one or more sources. Such sources may include video source 120 such as a television broadcaster, a video recorder, a remote server, a remotely or locally stored file or any other source of video. The IRD 110 may also receive multimedia segments from an audio-only source 130 such as a radio broadcaster, an audio recorder, a remote server, a remotely or locally stored file or any other source of audio. The IRD 110 may also receive multimedia segments from a generic data source 140 such a remote server that stores Web pages or calculates or compiles data for downloading to the IRD 110.

If the multimedia segments are video, then the presentation device 150 might be, for example, a television set or a computer monitor adapted to display a video. If the multimedia segments are audio-only, then the presentation device 150 may be a speaker of some sort. If the multimedia segment is a file or some other resource of generic data, then the presentation device 150 may be a computer monitor, or a television adapted to display data extracted from files.

Figure 2:
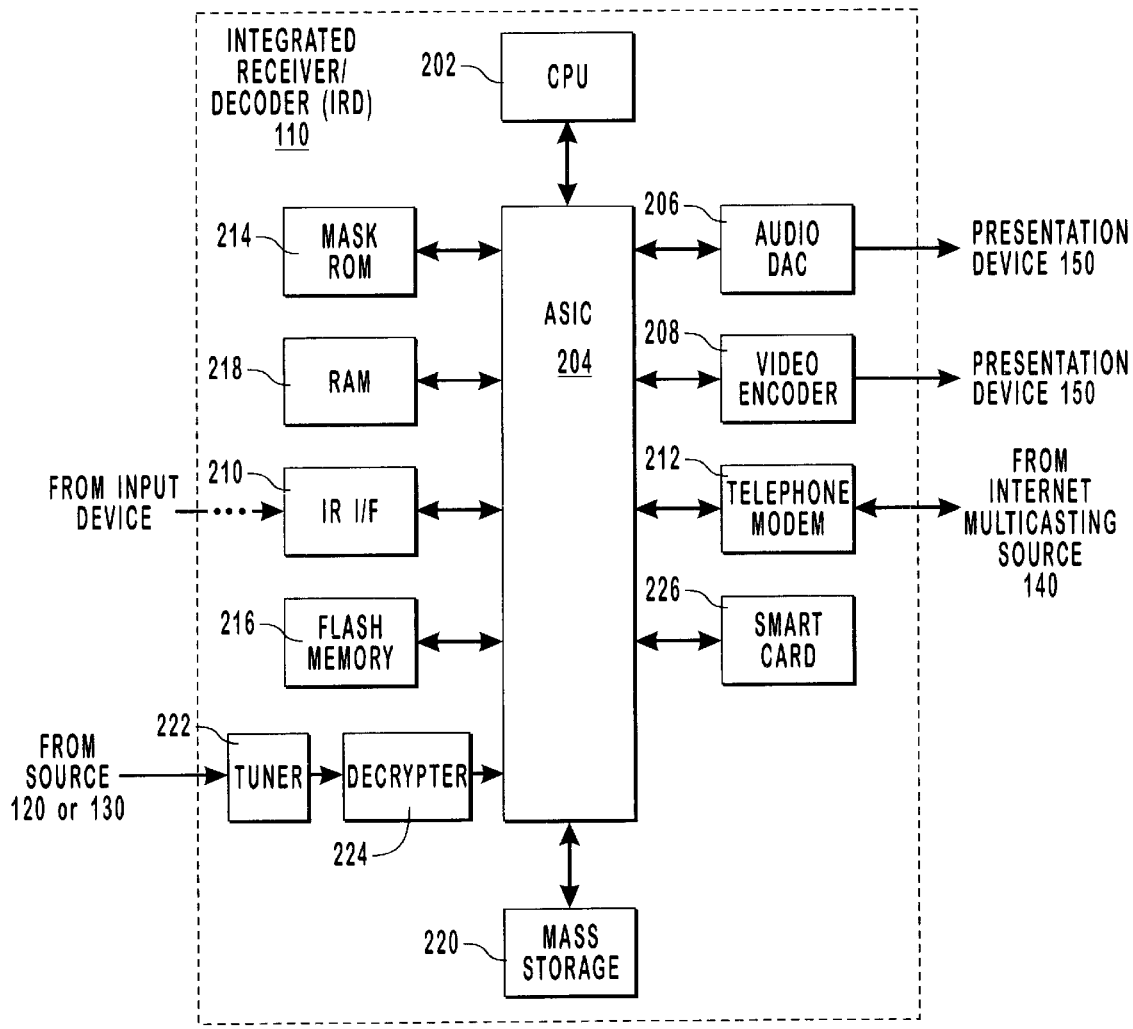
FIG. 2 schematically illustrates the internal hardware features of the Integrated Receiver/Decoder system of FIG. 1.

FIG. 2 depicts selected hardware elements of one embodiment of an IRD 110 of FIG. 1 that may be used to implement steps and specific acts of the invention. IRD 110 uses hardware and computer-executable instructions for providing the user with a graphical user interface, by which the user can access multimedia segments. Operation of the IRD 110 is controlled by a central processing unit (CPU) 202, which is coupled to an application-specific integrated circuit (ASIC) 204. CPU 202 executes computer program code means including computer-executable instructions designed to implement features of IRD 110, including some of the steps and acts of methods of the present invention. Individual acts of the present invention may be represented by individual computer-executable instructions or a group of computer-executable instructions. ASIC 204 contains circuitry which is used to implement certain functions of IRD 110. For example, ASIC 204 may be coupled to an audio digital-to-analog converter 206 and to a video encoder 208, which provide audio and video output, respectively, to the presentation device 150 of FIG. 1.

IRD 110 may further include an IR interface 210 for detecting infrared signals transmitted by a remote control input device, such as a hand-held device or a wireless keyboard. In response to the infrared signals, IR interface 210 provides corresponding electrical signals to ASIC 204. A modem 212 is coupled to ASIC 204 and receives Internet data. The modem 212 may be one modem or a group of modems. For example, the modem 212 may represent one or more of a telephone modem, an ISDN modem, a cable modem, or any other suitable communications device or network connector such as a network card.

Also coupled to ASIC 204 are a mask read-only memory (ROM) 214, a flash memory 216, and a random access memory (RAM) 218. Mask ROM 214 is non-programmable and provides storage of computer-executable instructions and data structures. Flash memory 216 may be a conventional flash memory device that can be programmed and erased electronically. Flash memory 216 may store Internet browser software as well as data structures. In one embodiment, a mass storage device 220 coupled to ASIC 204 is included in IRD 110. Mass storage device 220 may be used to supply computer-executable instructions and data structures to other components of IRD 110 or to store data received from video source 110, audio-only source 120, or data source 130. Mass storage device 220 may include any suitable medium for storing computer-executable instructions or data, such as magnetic disks, optical disks, and the like.

Application software and associated operating system software are stored in flash memory 216, or instead may be stored in any other suitable memory device, such as mask ROM 214, RAM 218 or mass storage device 220. The computer-executable instructions that are used to control access to multimedia services are executed by CPU 202. In particular, CPU 202 executes sequences of instructions contained in one or more of mask ROM 214, flash memory 216, RAM 218, and mass storage device 220 to perform certain steps of the present invention that will be more specifically disclosed hereinafter.

IRD 110 also includes a tuner 222 for tuning to video broadcasts and audio-only broadcasts. The tuner 222 may be any tuner capable of receiving the appropriate broadcast signal. For example, if the IRD 110 receives television broadcast content, the tuner 222 may be a Very High Frequency (VHF) tuner, an Ultra High Frequency (UHF) tuner, a Digital Video Broadcast Satellite (DVB-S) tuner, a Digital Video Broadcast Terrestrial (DVB-T) tuner, a digital American Television Standards Committee (ATSC) tuner, or any other suitable tuner. If the IRD 110 receives audio-only broadcast content, the tuner 222 may be an Amplitude Modulated (AM) tuner, a Frequency Modulated (FM) tuner, or any other suitable tuner. The tuner 222 is controlled directly by the ASIC 204, and indirectly by a user using a control device such as a remote control.

A decrypter 224 is provided between the tuner 222 and the ASIC 204 for decrypting tuned signals as appropriate. The decrypter 224 may be a software and/or software component. If a broadcaster wants to condition access to broadcast content, the broadcaster will typically encrypt or "scramble" the broadcast content before transmission. In this case, the broadcast content will remain in a scrambled state even after tuning using tuner 222. If the conditions for presentation are satisfied, a conditional access provider local to the IRD 110 will instruct the decrypter 224 to decrypt the broadcast content for presentation on the presentation device 150 of FIG. 1.

The IRD 110 may optionally also have a smart card 226 coupled to the ASIC 204. The smart card 226 may be debited as appropriate for cases in which access to broadcast content is conditioned upon the debiting of a smart card.

Those skilled in the art will appreciate that the invention is not limited to the environment and IRD illustrated in FIGS. 1 and 2. The invention may be practiced using other configurations, including personal computers, hand-held devices, multi-processor systems, microprocessor-based or programmable consumer electronics, network PCs, minicomputers, mainframe computers, and the like.

Figure 3:
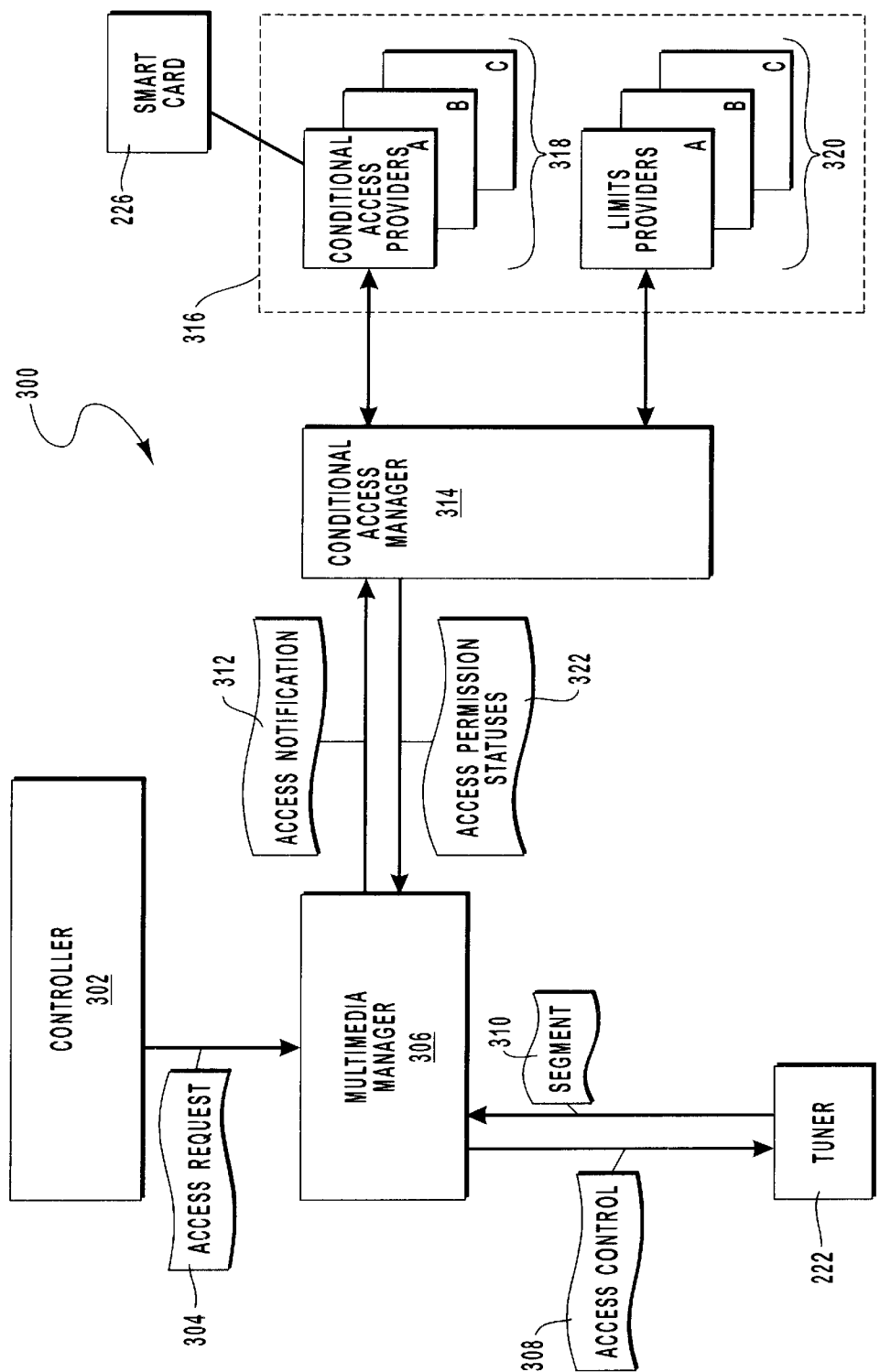
FIG. 3 illustrates a system implemented in the hardware of FIG. 2 and/or as software stored in the memory of FIG. 2.

FIG. 3 illustrates at least some components of a system 300 which may reside in and/or be implemented by the IRD 110 and operate to provide at least some of the features of the present invention. The components shown in FIG. 3 may be implemented in hardware and/or software. The structure and function of the components of FIG. 3 may best be understood by the following description of the operation of the system 300. This operation will be described with frequent reference to the structure of FIG. 3 and the method of FIG. 4.

Figure 4:
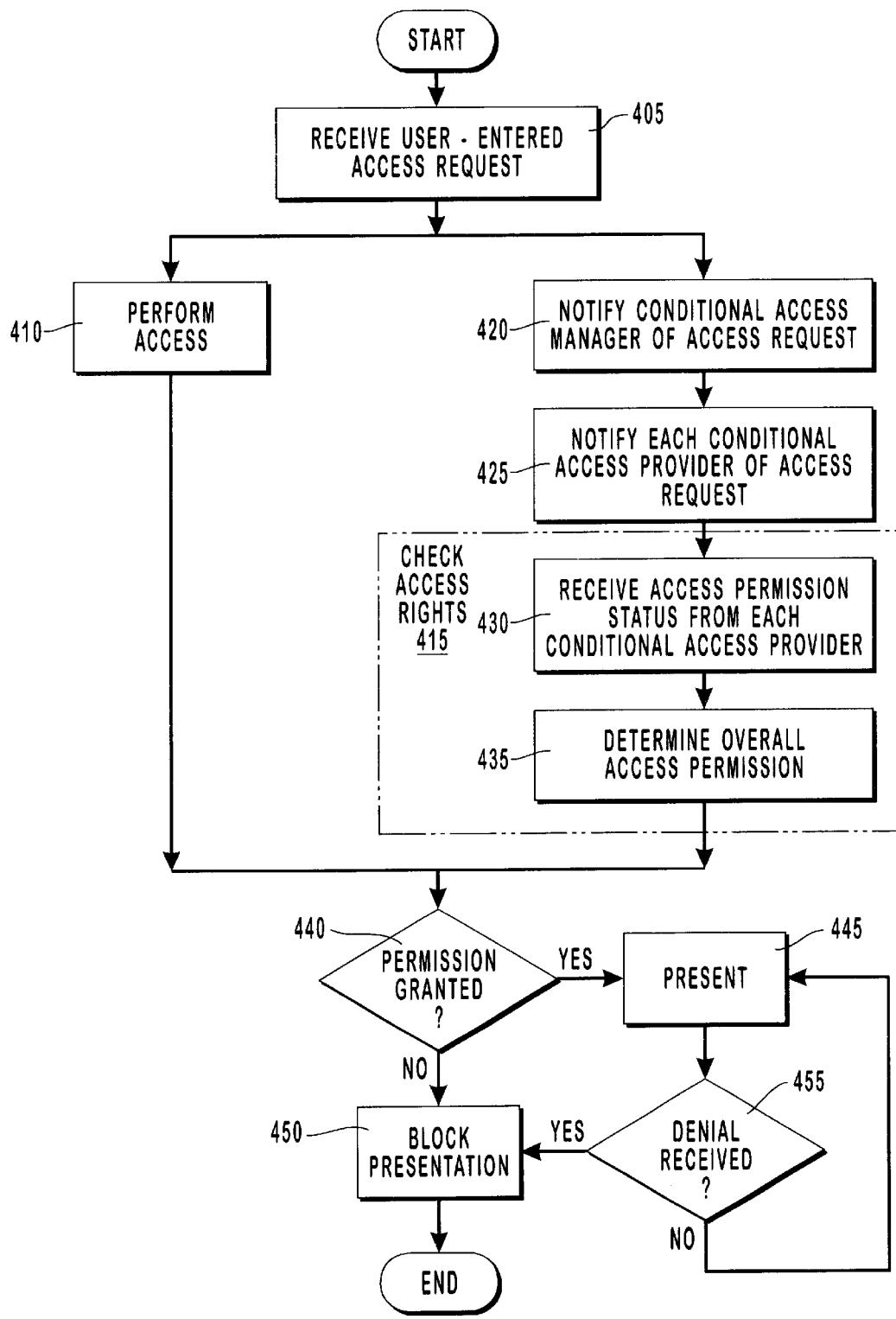
FIG. 4 illustrates a flowchart of a method for conditioning access using the system of FIG. 3.

The multimedia system 300 operates to access desired multimedia segments as illustrated by the flowchart of FIG. 4. The multimedia system 300 first receives a request to access a multimedia segment. Accordingly, embodiments within the scope of the present invention include a means and step for receiving a request to access a multimedia segment.

In the case of the multimedia segment being a broadcast, the means and step for receiving a request to access the multimedia segment includes a means and step for receiving a tune request corresponding to a desired broadcast program. Specifically, the user associated with the multimedia system 300 generates an electronic request to tune to the desired channel which is received by IRD 110. For example, in a tune operation, a viewer may generate a request operation using a remote control or other input device associated with IRD 110. In the case of a remote control, the request is received (step 405) at the IR interface 210, converted into an electronic request, and handled by rest of the multimedia system 300. In response to the user-entered tune request, a controller 302 generates an access request 304 corresponding to the requested tune operation. In the case of a tune, the controller 302 may be a TV control module exposed to an application layer or operating system using a Component Object Model (COM) interface. Specifically, the application layer calls a tune method within the TV control module.

In COM technology, software applications may be built using components. Each component is capable of performing one or more functions in assisting the software application. COM is a specification for building components and interfacing these components to build applications. An advantage of using COM components is that the components can be dynamically linked to the application while the application is running by being called by the application. In addition, COM allows components of a complex software application to be replaced without replacing and rewriting the entire application. Instead, only the component is rewritten, thus significantly reducing the complexity of upgrading software.

If the multimedia segment is a resource located on a network, the means and step for receiving a request to access the multimedia segment may include network software that displays the resource and then detects that a user has selected a resource. If the resource is located on the Internet, this selection is often performed by selecting a link representing the resource. If the resource is stored on a network, this selection may be also performed by selecting a displayed representation of the resource using the appropriate software.

If the multimedia segment is stored on another medium such as a tape, the means and step for receiving a request to access the multimedia segment may include pressing a play button on the appropriate player device such as a video recorder or audio recorder.

After the access request is received (step 405 of FIG. 4), the access operation is performed (step 410) while the user's access rights for the requested program are checked (step 415). To perform the access operation, a multimedia manager 306 controls an access module 222 (FIG. 2) by, for example, communicating an access control message 308 to the access module 222. The access module 222 accesses the desired multimedia segment, and passes the segment 310 back to the multimedia manager 306.

The nature of the access module 222 will depend on the source of the multimedia segment. For example, if the multimedia segment is a broadcast, the access module 222 will be a tuner appropriate to the broadcast. For Internet data, the access module 222 might be a modem or another Internet connector. For recorded video, the access module 222 might be a video recorder. For recorded audio, the access module 222 might be an audio recorder. For stored files, the access module 222 might be a file system in conjunction with a network connector such as a network driver if the file is stored on a network, or a file system in conjunction with a device driver if the file is stored locally in memory.

While the access operation is performed (step 410), the multimedia manager 306 notifies the conditional access manager 314 of the access request (step 420) using a means and step for sending a notification to the conditional access manager. This means and step might include sending the access notification 312 to the conditional access manager 314 using messaging, by making a function call on the conditional access manager 314 including the access notification as a parameter, or by any other means so long as the conditional access manager 316 is notified that the access request has been placed.

The conditional access manager 314 is a common standardized interface between the multimedia manager 306 and a plurality of conditional access providers within the box 316 defined by the dashed lines in FIG. 3 (hereinafter, "conditional access providers 316"). The conditional access manager 314 may be, for example, a COM interface. The conditional access manager 314 may be capable of interfacing with conditional access providers of a variety of different interface standards. For example, the conditional access manager 314 might be able to interface with conditional access providers that use the Digital Video Broadcast Common Interface (DVB-CI) standard used in Europe as well as interfacing with conditional access providers that use the Point Of Deployment (POD) interface standard used in the United States.

Once the conditional access manager 314 receives the access notification 312, the conditional access manager 314 notifies each of the conditional access providers 316 of the access request (step 425) using a means and step for querying each of the plurality of conditional access providers. This means and step might include sending a query to each of the conditional access providers using messaging, by making a function call on the conditional access manager 314 including the query as a parameter, or by any other means so long as each of the conditional access providers are queried to determine whether or not access should be granted.

The conditional access providers 316 may include one or more conditional access providers 318 (e.g., 318A, 318B and 318C) that are controlled based on limits set by the broadcaster. The conditional access providers 316 may also include one or more limits providers 320 (e.g., 320A, 320B and 320C) that are controlled based on limits set locally by, for example, a parent.

Once each of the conditional access providers 316 is notified of the access request (step 425), the access rights are determined using a means or step for determining whether the access to the segment 310 of the broadcast content should be granted based on responses to the queries (step 415). Such a means and step are now described.

Specifically, conditional access providers 316 each independently determine an access permission status corresponding to the desired segment 310. Specifically, for each of conditional access providers 316, if the conditional access provider conclusively knows that the segment 310 should not be viewed, that conditional access provider generates a "DENY" message. If the conditional access provider conclusively knows that the segment 310 may be viewed, and that the conditional access provider is able to provide a decrypt code to the decrypter 224, then that conditional access provider generates an "ACCEPT PRIMARY" message. If the conditional access provider does not know of any reason that the segment 310 should not be viewed, but does not conclusively know that the segment 310 may be viewed, the conditional access provider generates an "ACCEPT" message. This set of access permission statuses 322 such as the "DENY", "ACCEPT" and/or "ACCEPT PRIMARY" messages are transmitted through the conditional access manager 314 and ultimately received by the multimedia manager 306 (step 430). The above describes only an example of access permission statuses. Other access permission statuses may be used as long as the statuses are able to be evaluated to determine an overall permission status.

Figure 5:
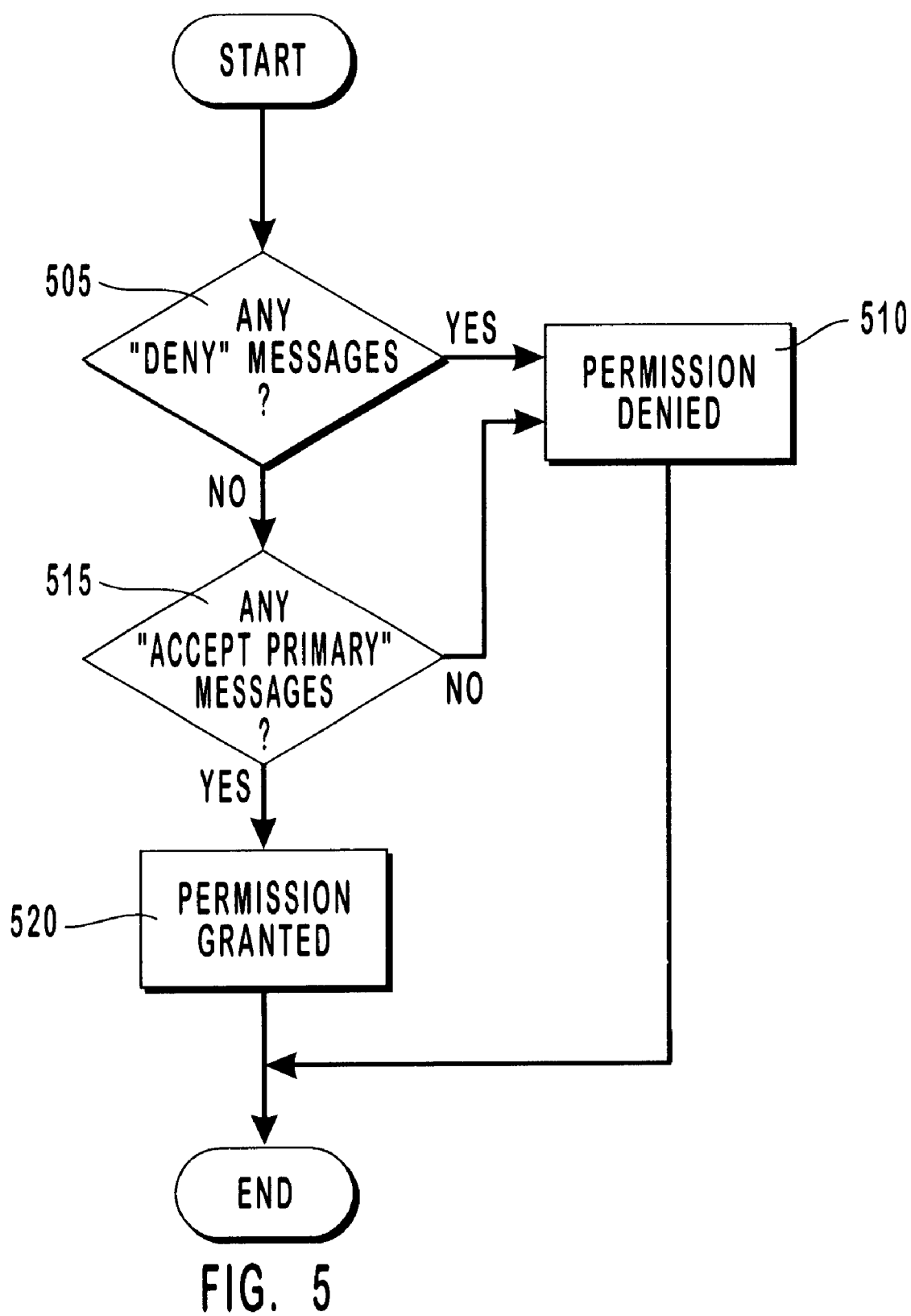
FIG. 5 illustrates a flowchart for determining an overall permission status based on information provided by the conditional access providers of FIG. 3.

From the access permission statuses 322, the multimedia manager 306 determines the overall access permission for the requested multimedia segment 310 (step 435). A method for determining this overall access permission (step 435) is shown in FIG. 5. Specifically, the multimedia manager 306 determines whether there are any deny messages (decision block 505).

If there are any "deny" messages, that means that at least one of the conditional access providers 316 conclusively knows that the segment 310 should not be presented. Thus, if there are any "deny" messages ("YES" in decision block 505), the overall permission status is "denied" meaning that the segment 310 should not be presented (step 510).

If there are no "deny" messages ("NO" in decision block 505), but there are also no "ACCEPT PRIMARY" messages ("NO" in decision block 515), then that means that although none of the conditional access providers 316 conclusively knows that the segment 310 should not be presented, still none of the conditional access providers 316 knows that the segment 310 should be presented, and none of the conditional access providers 316 can provide the necessary decrypt instruction to the broadcast manager 306. Thus, in this case, the overall permission status is still "denied" (step 510).

If, however, there are no "deny" messages ("NO" in decision block 505), but there is at least one "ACCEPT PRIMARY" message ("YES" in decision block 515), then the overall permission status is "granted" (step 520) meaning that the segment 310 should be presented.

If permission is granted to present the segment 310 (YES in decision block 440), the segment 310 is presented on the presentation device 150 (step 445). Otherwise (NO in decision block 440), the multimedia manager 306 blocks the multimedia segment 310 from being presented (step 450) and the method ends for that access request.

Even though the multimedia manager 306 may initially grant access to the segment 310, any one of the conditional access providers 316 may generate a "DENY" message at any time. If such a "DENY" message is received by the multimedia manager 306 (YES in decision block 455), presentation of the segment 310 is blocked (step 450). This might occur, for example, in the case of a pay-per-view program. The pay-per-view license period may be only for a few hours. Once this period lapses, the conditional access provider that governs access to the segment 310 may be programmed to issue the "DENY" message at that time so that additional services are not obtained by the viewer without further compensation. Also, a conditional access provider may correspond to a premium channel. Thus, the conditional access provider may be programmed to issue the "DENY" message if the viewer lets the subscription lapse. In this manner, a multimedia segment such as a television program may be accessed and blocked if access is not permitted by either the broadcaster or by a parent.

There are several further flexibilities in the IRD 110. For example, if a conditional access provider generates a "DENY" message, the IRD 110 could also indicate the conditions needed to grant access. The IRD 110 may accomplish this with the aid of the conditional access provider that generated the "DENY" message. For example, the conditional access provider may provide a HyperText Markup Language (HTML) format document that indicates terms of a contract that need to be accepted before access will be granted. Once the user accepts those terms, a new access request may be generated. This time, however, the conditional access provider that previously denied the request will grant access.

The IRD 110 might also indicate the conditions needed to grant access by using a remote server. Specifically, in response to the user indicating that access is desired, the IRD 110 might generate a Globally Unique IDentifier (GUID) which identifies the transaction needed to obtain access. The GUID is then transferred to the remote server within a request to obtain access, or at least a request to review the terms needed to obtain access. The remote server then might transmit a purchasing object having a purchasing method that could be executed to make payment and complete the transaction so that the conditional access provider that denied permission would then grant permission. The remote server might also transmit a text string in the form of, for example, an HTML page that lists the terms of the contract.

In the case where payment needs to be made to grant access, and where a contract exists for the debiting of an account in payment for the multimedia segment, the appropriate conditional access provider may debit a smart card associated with the conditional access provider such as a smart card 226 associated with the conditional access provider 318A. In the alternative, the conditional access provider may use the modem 212 to access the Internet and debit a previously set up online account for the service.

The Integrated Receiver/Decoder 110 has been described as accessing the multimedia segment while the permission statuses are being determined. However, the invention is not intended to be so limited. The IRD 110 might be configured to access the multimedia segment only after the IRD 110 determines that the access permission should be granted.

The access request 304 has been described as resulting in the access of a multimedia segment if access permission is granted. However, the access request 304 may instead be a query to determine if a multimedia segment may be viewed at some future time. The IRD 110 would determine the access permission as described above. However, instead of presenting or blocking the multimedia segment, the IRD 110 may simply report the permission determination to the user through the presentation device 150. Thus a user could, for example, determine whether permission would be granted to view a football game scheduled to be broadcasted two weeks from Monday before inviting her friends over to view the football game. Thus, the user could avoid embarrassment and inconvenience should the football game be blocked for some reason.

There may be cases in which the appropriate conditional access provider cannot be queried for permission status using the conditional access manager 314 even though the conditional access manager 314 is a standardized interface. In these cases, the IRD 110 may be configured to load an appropriate interface that may be used to query the appropriate conditional access provider. Then the access notification may be sent to both the conditional access manager 314 and the newly loaded interface. Thus, the IRD 110 may interact with conditional access providers even if they are not compatible with the conditional access manager 314.

The above describes a system and method for conditioning access to multimedia segments using a single interface that interacts with a plurality of conditional access providers. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In a system capable of displaying multimedia segments, a method of interfacing with a plurality of conditional access providers that are each capable of automatically limiting access to the multimedia segments according to one or more predetermined limits, wherein the method interfaces with each of the plurality of conditional access provider using a standardized interface even though the plurality of conditional access providers follow different interface standards, the method comprising the following:

a specific act of receiving a request to access a multimedia segment;

a specific act of sending a notification to a conditional access manager upon receipt of the request, wherein the conditional access manager is a single standard interface between the system and the plurality of conditional access providers;

a specific act of the conditional access manager querying each of the plurality of conditional access providers in response to the notification to determine whether access to the multimedia segment should be granted;

a specific act of receiving responses back from each of the plurality of conditional access providers in response to the queries, such that each conditional access provider independently determines an access permission corresponding to the segment that indicates whether access to the multimedia segment should be granted and that is based on one or more predetermined limits;

a specific act of evaluating the responses from each of the plurality of conditional access providers; and a specific act of determining whether access to the multimedia segment should be granted based on the evaluation, wherein access to the multimedia segment is denied if any of the plurality of conditional access providers indicates the indicates the multimedia segment should not be present by the system.

2. The method according to claim 1, further comprising the following:

a specific act of determining that the conditional access manager cannot interface with a conditional access provider needed to grant or deny access to the requested multimedia segment;

a specific act of loading an interface needed to interface with the conditional access provider needed to grant or deny access to the requested multimedia segment; and a specific act of interfacing with the conditional access provider needed to grant or deny access through the loaded interface instead of through the conditional access provider.

3. The method according to claim 1, wherein the specific act of receiving a request to access a multimedia segment comprises the following:

a specific act of receiving a request to tune to a television program.

4. The method according to claim 1, wherein the specific act of receiving a request to access a multimedia segment comprises the following:

a specific act of receiving a request to tune to a radio program.

5. The method according to claim 1, wherein the specific act of receiving a request to access a multimedia segment comprises the following:

a specific act of receiving a request to access the Internet.

6. The method according to claim 1, wherein the specific act of receiving a request to access a multimedia segment comprises the following:

a specific act of receiving a request to access a Pay-Per-View program.

7. The method according to claim 1, wherein the specific act of receiving a request to access a multimedia segment comprises the following:

a specific act of receiving a request to access a remotely stored file on a Local Area Network.

8. The method according to claim 1, wherein the specific act of receiving a request to access a multimedia segment comprises the following:

a specific act of receiving a request to access a file.

9. The method according to claim 1, wherein the request to access a multimedia segment comprises a query to determine if access to the multimedia segment may be granted at a future time.

10. The method according to claim 1, further comprising the following:
   a specific act of presenting the multimedia segment when it has been determined that access to the multimedia segment should be granted.

11. The method according to claim 1, further comprising the following:
   a specific act of preventing the multimedia segment from being presented when it has not been determined that access to the segment of the broadcast content should be granted.

12. The method according to claim 11, further comprising:
   a specific act of presenting a document that contains terms of a contract that governs access to the multimedia segment;
   a specific act of receiving an indication that the terms of the contract are accepted; and
   a specific act of presenting the segment after receiving the indication that the terms of the contract are accepted.

13. The method according to claim 12, wherein the specific act of presenting a document that contains terms of a contract that governs access to the multimedia segment comprises the following:
   a specific act of transmitting a Globally Unique Identifier identifying a transaction needed to access the multimedia segment to a remote server;
   a specific act of receiving a purchasing object from the remote server; the purchasing object including a purchasing method needed to complete the transaction; and
   a specific act of receiving the document from the remote server.

14. The method according to claim 1, wherein the plurality of conditional access providers includes at least one limits provider.

15. The method according to claim 1, wherein the specific act of determining whether the access to the multimedia segment should be granted based on the evaluation comprises the following:
   a specific act of receiving either a denial message, an accept message, or an accept primary message from each of the plurality of conditional access providers, wherein the denial message indicates that the corresponding conditional access provider; has determined that the segment should not be presented, wherein the accept message indicates that the corresponding conditional access provider does not know of any reason why the segment should not be displayed, a wherein the accept primary message indicates that the corresponding conditional access provider has determined that the segment should be displayed and that the corresponding conditional access provider has the ability to decode the segment.

16. The method according to claim 1, further comprising the following:
   an act of displaying the segment, and
   an act of debiting an account for displaying the segment.

17. The method according to claim 16, wherein the specific act of debiting the account comprises the following:
   a specific act of debiting a smart card accessible by the system.

18. The method according to claim 16, wherein the specific act of debiting the account comprises the following:
   a specific act of accessing the account over the Internet.

19. The method according to claim 1, further comprising the following:
   a specific act of accessing the broadcast segment during the specific act of determining whether the access to the segment of the broadcast content should be granted.

20. The method according to claim 1, wherein the request is a first request, the multimedia segment is a first multimedia segment, it notification is a first notification, the queries are first queries, the responses are first responses, and the evaluation is a first evaluation, the method further comprising the following:
   a specific act of receiving a second request to access a second multimedia segment;
   a specific act of sending a second notification to the conditional access manager upon receipt of the second request;
   a specific act of the conditional access manager querying each of the plurality of conditional access providers in response to the second notification to determine whether access to the second multimedia segment should be granted;
   a specific act of receiving second responses back from each of the plurality of conditional access providers in response to the second queries;
   a specific act of evaluating the second responses from each of the plurality of conditional access providers; and
   a specific act of determining whether access to the second multimedia segment should be granted based on the second evaluation.

21. In a system capable of displaying multimedia segments, a method of interfacing with a plurality of conditional access providers that are each capable of automatically limiting access to the multimedia segments, wherein the method interfaces with each of the plurality of conditional access providers using a standardized interface even though the plurality of conditional access providers follow different interface standards, the method comprising the following:
   a specific act of receiving a request to access a multimedia segment;
   a specific act of sending a notification to a conditional access manager upon receipt of the request, wherein the conditional access manager is the single standard interface between the system and the plurality of conditional access providers;
   a specific act of the conditional access manager querying each of the plurality of conditional access providers in response to the notification to determine whether access to the multimedia segment should be granted, such that each conditional access provider provides a response indicating whether the system should be presented access to the multimedia segment;
   a step for determining whether the access to the multimedia segment should be granted based on responses to the queries, such that access to the multimedia segment is denied if any of the plurality of conditional access providers indicates the multimedia segment should not be presented to the system.

22. The method according to claim 21, wherein the step for determining whether the access to the multimedia segment should be granted comprises the following:
   a specific act of receiving responses back from each of the plurality of conditional access providers in response to the queries;

a specific act of evaluating the response from each of the plurality of conditional access providers; and a specific act of determining whether the access to the multimedia segment should be granted based on the evaluation.

23. The method according to claim 21, wherein the specific act of receiving a request to access a multimedia segment comprises the following:

a specific act of receiving a request to tune to a television program.

24. The method according to claim 21, further comprising the following:

a specific act of presenting the multimedia segment when it has been determined that the access to the multimedia segment should be granted.

25. The method according to claim 21, further comprising:

a specific act of presenting a document that contains terms of a contract that governs access to the multimedia segment;

a specific act of receiving an indication that the terms of the contract are accepted; and a specific act of presenting the multimedia segment after receiving the indication that the terms of the contract are accepted.

26. The method according to claim 21, further comprising the following:

an act of displaying the segment; and an act of debiting an account for displaying the multimedia segment.

27. The method according to claim 26, wherein the specific act of debiting the account comprises the following:

a specific act of debiting a smart card accessible by the system.

28. The method according to claim 26, wherein the specific act of debiting the account comprises the following:

a specific act of accessing the account over the Internet.

29. A computer-readable medium for providing program code means including computer-executable instructions for performing the specific acts and the step recited in claim 21.

30. A method as recited in claim 1, wherein the predetermined limits are set by a broadcaster.

31. A method as recited in claim 21, wherein the plurality of conditional access providers includes at least one conditional access provider that is configured to utilize the DVB-CI interface standard and at least one conditional access provider that is configured to utilize the POD interface standard.

32. A computer-readable medium for providing program code means including computer-executable instructions for performing the specific acts recited in claim 1.

33. A system capable of displaying multimedia segments, the system comprising the following:

a controller;

a multimedia manager coupled to the controller so as to receive a request to access a multimedia segment from the controller;

a conditional access manager coupled to the multimedia manager so as to receive from the multimedia manager a notification of the request, wherein the conditional access manager interfaces with a plurality of different conditional access providers that are each configured to determine whether access to the multimedia segment should be granted, wherein the conditional access manager queries each of the plurality of conditional access provides and receives a corresponding response from each of the conditional access providers that indicates whether access to the multimedia segment should be granted to the system, wherein the conditional access manager is coupled to the multimedia manager so as to notify the multimedia manager of any responses received from the plurality of conditional access providers, and wherein the multimedia manager is configured to determine based on the responses whether the multimedia segment should be presented, wherein access to the multimedia segment is denied if any of the plurality of conditional access providers indicates in a response to the queries that the multimedia segment should not be presented to the system.

* * * * *

UNITED STATES PATENT AND TRADEMARK OFFICE
CERTIFICATE OF CORRECTION

PATENT NO. : 6,637,027 B1
DATED : March 16, 2000
INVENTOR(S) : Breslauer et al.

It is certified that error appears in the above-identified patent and that said Letters Patent is hereby corrected as shown below:

Column 1,
Line 36, after "include" please change "able" to -- cable --

Column 23,
Line 55, after "are any" please remove "deny" and insert -- deny --

Column 11,
Line 57, after "access" please change "provider" to -- providers --

Column 13,
Line 46, after "access" please change "provider" to -- providers --
Line 50, after "displayed," please delete "a"

Column 15,
Line 23, after "contract" please change "arc" to -- are --

Column 16,
Line 26, after "access" please change "provider" to -- providers --

Signed and Sealed this

Twentieth Day of July, 2004

JON W. DUDAS
*Acting Director of the United States Patent and Trademark Office*